United States Patent
Lee et al.

(10) Patent No.: US 7,102,952 B2
(45) Date of Patent: Sep. 5, 2006

(54) METHOD AND APPARATUS FOR INCREASING DATA READ SPEED IN A SEMICONDUCTOR MEMORY DEVICE

(75) Inventors: Chan-Yong Lee, Suwon-si (KR); Jung-Hwa Lee, Suwon-si (KR)

(73) Assignee: Samsung Electronics Co., Ltd., Suaon-si (KR)

( * ) Notice: Subject to any disclaimer, the term of this patent is extended or adjusted under 35 U.S.C. 154(b) by 0 days.

(21) Appl. No.: 10/915,036

(22) Filed: Aug. 10, 2004

(65) Prior Publication Data
US 2005/0036388 A1  Feb. 17, 2005

(30) Foreign Application Priority Data
Aug. 12, 2003  (KR) .................... 10-2003-0055898

(51) Int. Cl.
*G11C 5/14* (2006.01)

(52) U.S. Cl. ................ 365/226; 365/189.09; 365/205; 365/208

(58) Field of Classification Search ................. None
See application file for complete search history.

(56) References Cited

U.S. PATENT DOCUMENTS

| | | | | |
|---|---|---|---|---|
| 6,031,779 | A | * | 2/2000 | Takahashi et al. .......... 365/226 |
| 6,088,275 | A | * | 7/2000 | Tanaka ...................... 365/205 |
| 6,324,111 | B1 | * | 11/2001 | Sato et al. .................. 365/207 |
| 6,392,944 | B1 | * | 5/2002 | Kono ......................... 365/208 |
| 6,717,460 | B1 | * | 4/2004 | Yamauchi et al. .......... 327/544 |

* cited by examiner

*Primary Examiner*—Son Mai
(74) *Attorney, Agent, or Firm*—F. Chau & Associates, LLC

(57) ABSTRACT

A semiconductor memory device having a data read path maintains a higher power voltage supplied to an input/output sense amplifier in the input/output path, through which data passes during a data read operation, than the voltage supplied to other circuit components in the data read path, thereby achieving a high data read speed.

14 Claims, 3 Drawing Sheets

METHOD AND APPARATUS FOR INCREASING DATA READ SPEED IN A SEMICONDUCTOR MEMORY DEVICE

CROSS-REFERENCE TO RELATED APPLICATION

This application claims the benefit of Korean Patent Application No. 2003-55898, filed Aug. 12, 2003, the disclosure of which is incorporated herein by reference in its entirety.

BACKGROUND

1. Technical Field

The present invention relates to a semiconductor memory device and, more particularly, to a data read path that increases data read speed and lowers power consumption in the semiconductor memory device.

2. Discussion of the Related Art

FIG. 1 is a block diagram illustrating a data read path of a memory cell in a conventional semiconductor memory device. In the conventional semiconductor memory device of FIG. 1, the same internal power voltage (hereinafter, referred to as "IVC") is supplied to the whole data read path, which amplifies data of a memory cell (not shown) and reads it. The data read path includes a first MUX 10, an input/output sense amplifier (hereinafter, referred to as "IOSA") 20, a second MUX 30, an output buffer circuit 40, an output driver circuit 50, and an internal power supply circuit 60. During a data read operation, data of the memory cell is outputted to a global line pair GIO and GIOB, passes through the first MUX 10 and is amplified in the IOSA 20. The data amplified in the IOSA 20 is converted to data having an appropriate bit organization in the second MUX 30. The data is outputted to an external terminal through the output buffer circuit 40 and the output driver circuit 50. The output buffer circuit 40 controls the output driver circuit 50. As described above, since the data of the memory cell goes through many circuit components until it reaches an output terminal, a predetermined delay time is incurred before the data is outputted.

Therefore, when a semiconductor memory device is used in a system requiring a high operation frequency, a need exists for a method and apparatus that reduces the delay time tAA caused by various circuit components before the data is outputted.

One conventional method for reducing the delay time tAA is by increasing the IVC level of the whole data read path to improve both data read speed and current driving abilities of transistors that constitute the circuit placed on the path.

FIG. 2 is a block diagram illustrating a data read path of a memory cell with circuit components that have improved operation speed when a voltage supplied to the data read path is increased by a predetermined level. Referring to FIG. 2, the data read path includes a first MUX 10, an input/output sense amplifier (hereinafter, referred to as "IOSA") 20, a second MUX 30, an output buffer circuit 40, an output driver circuit 50, and an internal power supply circuit 60. The data read operation illustrated in FIG. 2 is similar to the operation described in FIG. 1 except that there is an increase of data transmission speed in respective circuit components. In detail, FIG. 2 shows the different percentages that the data transmission rate in respective circuit components is improved when the IVC supplied from the internal power supply circuit 60 is increased by Va (For example, 0.1 volts~0.2 volts). Assuming that the overall percentage of improvement of an operation speed of all circuit components placed on the data read path is 100%, FIG. 2 shows that the IOSA 20 is improved by 63%, the second MUX 30 is improved by 12%, the output buffer circuit 40 is improved by 10%, and the output driver circuit 50 is improved by 15%.

As shown in FIG. 2, when the IVC supplied from the internal power supply circuit 60 is increased by Va (e.g., 0.1 volts~0.2 volts), among all circuit components placed on the data read path, an improved percentage of an operation speed of the IOSA 20 reaches about 63%. Therefore, if only the power voltage supplied to the IOSA 20 is increased, without increasing the power voltage of other circuit components placed on the data read path, the data read speed should have similar increases as to the increases resulted when the power voltage is supplied to all of the circuit components.

However, the method of increasing the power voltage supplied to all circuit components on the data read path increases the operation current of the semiconductor memory. Further, the second MUX 30 performs a bit organization of data transmitted through the data read path, the output buffer circuit 40 is synchronized with a clock signal to output data to the output driver circuit, and the output driver circuit 50 outputs data to an external terminal. The aforementioned three circuit components draw an increased amount of current if the applied voltage is increased and thereby increase power consumption. A need therefore exists for a semiconductor memory device having a data read speed with minimal delay and power consumption.

SUMMARY OF THE INVENTION

According to an exemplary embodiment of the present invention, a method for increasing data read speed and decreasing power consumption in data read operation of a semiconductor memory device comprising: applying a first internal power voltage to an input/output sense amplifier; and applying a second internal power voltage to a plurality of circuit components excluding the input/output sense amplifier.

According to another exemplary embodiment of the present invention, the semiconductor memory device comprises a first internal power supply circuit for generating a power voltage supplied to an input/output sense amplifier and a second internal power supply circuit for generating a power voltage supplied to the other circuit component on the input/output path. The internal power voltage generated by the first internal power supply circuit is greater than the internal power voltage generated by the second internal power supply circuit by a predetermined value. Preferably, the predetermined value is in a range between 0.1 volts and 0.2 volts.

According to still another exemplary embodiment of the present invention, the semiconductor memory device further includes a coupling capacitor between the first and second internal power supply circuit.

BRIEF DESCRIPTION OF THE DRAWINGS

The above features of the embodiments of the present invention will become more apparent to those of ordinary skill in the art by describing in detail exemplary embodiments thereof with reference to the attached drawings in which.

DETAILED DESCRIPTION OF PREFERRED EMBODIMENTS OF THE INVENTION

The exemplary embodiments of the present invention will now be described more fully hereinafter with reference to the accompanying drawings. This invention may, however, be embodied in different forms and should not be construed as limited to the embodiments set forth herein. Rather, these embodiments are provided so that this disclosure will be thorough and complete, and will fully convey the scope of the invention to those skilled in the art.

Figure 1:
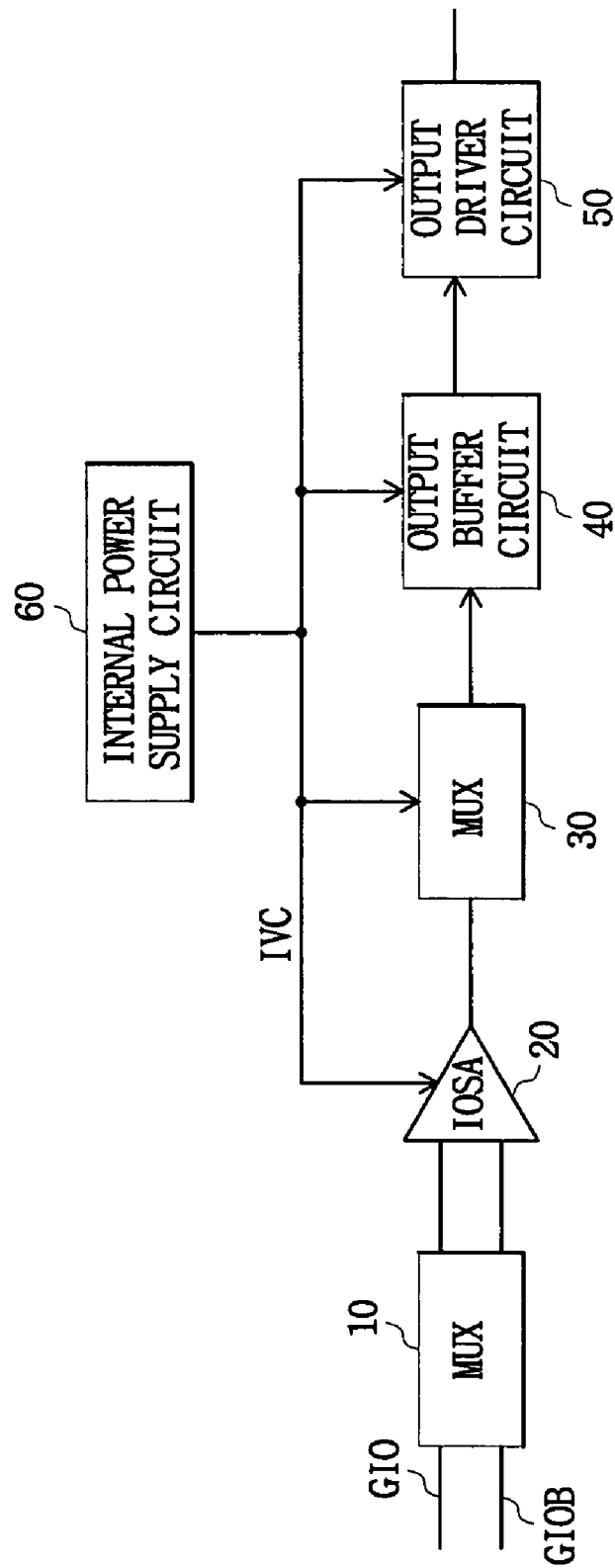
FIG. 1 is a block diagram illustrating a data read path of a memory cell in a conventional semiconductor memory device.
Figure 2:
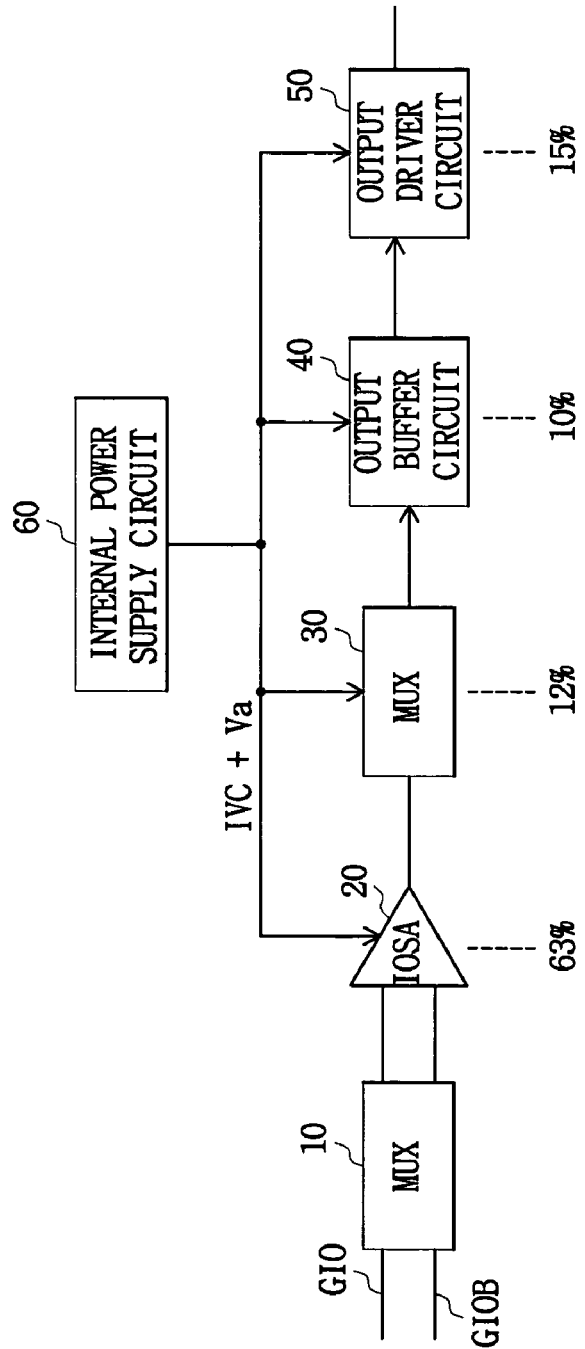
FIG. 2 is a block diagram illustrating a data read path of a memory cell having an improved operation speed in respective circuit components when a voltage supplied to the data read path is increased by a predetermined level.
Figure 3:
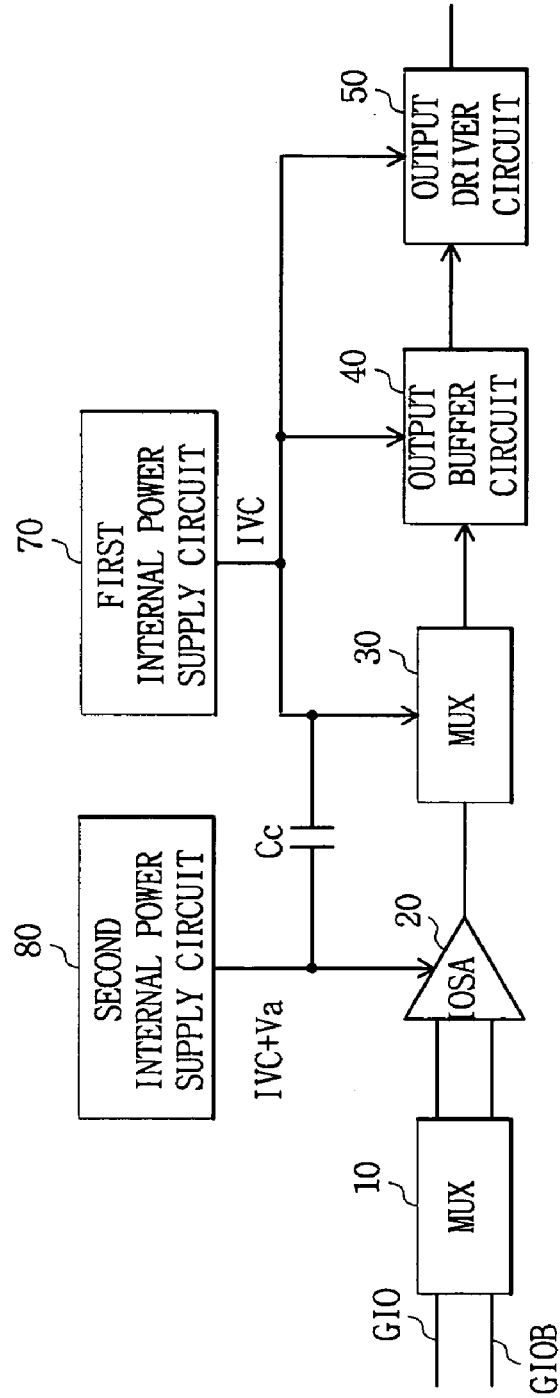
FIG. 3 is a block diagram illustrating a data read path of a memory cell in a semiconductor memory device according to a preferred embodiment of the present invention.

FIG. 3 is a block diagram illustrating a data read path of a memory cell in a semiconductor memory device according to a preferred embodiment of the present invention.

Referring to FIG. 3, a data read path of a semiconductor memory device according to an embodiment of the present invention includes a first MUX 10, an input/output sense amplifier (hereinafter, IOSA) 20, a second MUX 30, an output buffer circuit 40, an output driver circuit 50, a first internal power supply circuit 70, a second internal power supply circuit 80, and a coupling capacitor Cc.

During a data read operation, data of the memory cell is outputted to a global line pair GIO and GIOB, passes through the first MUX 10 and is amplified in the IOSA 20. The data amplified in the IOSA 20 is converted to data having an appropriate bit organization in the second MUX 30. The data is outputted to an external terminal through the output buffer circuit 40 and the output driver circuit 50. The output buffer circuit 40 controls the output driver circuit 50.

In the data read path of the semiconductor memory device of FIG. 3, an increased internal power voltage IVC+Va is applied to the IOSA 20, one component among all circuit components in the data read path, and an original internal power voltage IVC is applied to the rest of the circuit components. In FIG. 3, the first internal power supply circuit 70 is a circuit for generating the original internal power voltage IVC, and the second internal power supply circuit 80 is a circuit for generating the increased internal power voltage IVC+Va. The internal power voltage IVC is supplied to the second MUX 30, the output buffer circuit 40, and the output driver circuit 50, and the increased internal power voltage IVC+Va is supplied to the IOSA 20. The coupling capacitor Cc connects the first internal power supply circuit 70 to the second internal power supply circuit 80.

As described above, the increased internal power voltage IVC+Va is applied to the IOSA 20, the component that has greatest effect in data read speed among all circuit components in the data read path. The original internal power voltage IVC is applied to the rest of the circuits. Therefore, the data read speed is improved while the power consumption is decreased.

When different internal power voltages exist in a data read path, and when the internal power voltage IVC encounters external noise, the increased internal power voltage IVC+Va may not follow the internal power voltage IVC. This renders effective power level substantially lowered. As shown in FIG. 3, a coupling capacitor Cc is connected between the first internal power supply circuit 70 and the second internal power supply circuit 80 to overcome this effect.

A power supply node of the increased internal power voltage IVC+Va connected to only the IOSA has a very small capacitance compared to a power supply node of the internal power voltage IVC connected to the rest of the circuit components except the IOSA. Therefore, by arranging the coupling capacitor Cc between the first and second internal power supply circuit, a voltage variation due to noise of the internal power voltage IVC is immediately transferred to the internal power voltage IVC+Va.

As described above, according to the embodiments of the present invention, a high data read speed is achieved by applying an increased internal power voltage IVC+Va only to the IOSA which has the greatest effect on improving the data read operation speed. In the meantime, since an original voltage is applied to the rest of the circuit components, power consumption by these components is lower than the conventional method of applying an increased voltage to all of the circuit components. Further, by providing a coupling capacitor between the first and second internal power supply circuits 70 and 80, the level of the internal power voltage IVC+Va is not affected by the voltage variation due to signal disturbances and thus maintained at a desired level. While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method for increasing data read speed in a data read operation of a semiconductor memory device, comprising:
   applying a first internal power voltage to an input/output sense amplifier which amplifies data of a data line pair;
   applying a second internal power voltage to a plurality of circuit components excluding the input/output sense amplifier; and
   coupling the first and second internal power supply circuit by a coupling capacitor.

2. The method of claim 1, further comprising:
   generating the first internal power voltage applied to the input/output sense amplifier by a first internal power supply circuit; and
   generating the second internal power voltage supplied to the plurality of circuit components excluding the input/output sense amplifier in the input/output path by a second internal power supply circuit.

3. The method of claim 2, wherein the first internal power voltage generated by the first internal power supply circuit is greater than the second internal power voltage generated by the second internal power supply circuit by a predetermined value.

4. The method of claim 3, wherein the predetermined value is in a range between 0.1 volts and 0.2 volts.

5. A data read path of a memory cell, comprising:
   a first internal power supply circuit connected to an input/output sense amplifier which amplifies data of a data line pair;
   a second internal power supply circuit connected to a plurality of circuit components excluding the input/output sense amplifier in the data read path; and
   a coupling capacitor connecting the first and the second internal power supply circuits.

6. The data read path of claim 5, wherein the first internal power supply circuit generates a first internal power voltage that is greater than a second internal power voltage generated by the second power supply circuit by a predetermined value.

7. The data read path of claim 6, wherein the predetermined value is in a range between 0.1 volts and 0.2 volts.

8. The data read path of claim 5, wherein the plurality of circuit components include:
- a multiplexer for performing a bit organization to data sent from the input/output sense amplifier;
- an output buffer circuit for synchronizing with a clock signal and sending data received from the multiplexer to an output driver circuit; and
- the output driver circuit for outputting data to an external terminal.

9. A semiconductor memory device comprising a data read path formed by:
- a multiplexer for receiving data of a memory cell of the semiconductor memory device;
- an input/output sense amplifier for amplifying data passing through the data read path;
- a multiplexer for performing a bit organization to the data sent from the input/output sense amplifier;
- an output buffer circuit for synchronizing with a clock signal and sending data received from the multiplexer to an output driver circuit; and
- the output driver circuit for outputting data to an external terminal, wherein
- a first internal power supply circuit connected to the input/output sense amplifier; and
- a second internal power supply circuit connected to the data read path components excluding the input/output sense amplifier.

10. The semiconductor memory device of claim 9, wherein the first internal power supply circuit generates a first internal power voltage that is greater than a second internal power voltage generated by the second power supply circuit by a predetermined value.

11. The semiconductor memory device of claim 10, wherein the predetermined value is in a range between 0.1 volts and 0.2 volts.

12. The semiconductor memory device of claim 9, further comprising a coupling capacitor connecting the first and the second internal power supply circuits.

13. A data read path of a memory cell, comprising:
- a first internal power supply circuit connected to an input/output sense amplifier in the data read path;
- a second internal power supply circuit connected to a plurality of circuit components excluding the input/output sense amplifier in the data read path; and
- a coupling capacitor connecting the first and the second internal power supply circuits.

14. A data read path of a memory cell, comprising:
- a first internal power supply circuit connected to an input/output sense amplifier which amplifies data of a data line pair; and
- a second internal power supply circuit connected to a plurality of circuit components excluding the input/output sense amplifier in the data read path, wherein the plurality of circuit components include:
- a multiplexer for performing a bit organization to data sent from the input/output sense amplifier;
- an output buffer circuit for synchronizing with a clock signal and sending data received from the multiplexer to an output driver circuit; and
- the output driver circuit for outputting data to an external terminal.

* * * * *